(12) United States Patent
Borthakur et al.

(10) Patent No.: US 7,989,266 B2
(45) Date of Patent: Aug. 2, 2011

(54) METHODS FOR SEPARATING INDIVIDUAL SEMICONDUCTOR DEVICES FROM A CARRIER

(75) Inventors: Swarnal Borthakur, Boise, ID (US); Andy Perkins, Boise, ID (US); Rick Lake, Meridian, ID (US); Marc Sulfridge, Boise, ID (US)

(73) Assignee: Aptina Imaging Corporation, George Town (KY)

( * ) Notice: Subject to any disclaimer, the term of this patent is extended or adjusted under 35 U.S.C. 154(b) by 28 days.

(21) Appl. No.: 12/487,547

(22) Filed: Jun. 18, 2009

(65) Prior Publication Data

US 2010/0323469 A1 Dec. 23, 2010

(51) Int. Cl.
*H01L 21/00* (2006.01)

(52) U.S. Cl. ... 438/110; 438/63; 438/458; 257/E21.499; 257/E21.599

(58) Field of Classification Search .......... 438/63; 257/E21.598, E21.6
See application file for complete search history.

(56) References Cited

U.S. PATENT DOCUMENTS

| | | | |
|---|---|---|---|
| 5,904,548 A * | 5/1999 | Orcutt | 438/462 |
| 6,023,103 A | 2/2000 | Chang et al. | |
| 6,066,512 A | 5/2000 | Hashimoto | |
| 6,163,014 A * | 12/2000 | Bergeron et al. | 219/388 |
| 6,222,145 B1 | 4/2001 | Cook et al. | |
| 6,228,687 B1 | 5/2001 | Akram et al. | |
| 6,274,405 B1 | 8/2001 | Hashimoto | |
| 6,368,893 B1 | 4/2002 | Tani et al. | |
| 2005/0224978 A1 * | 10/2005 | Kawate et al. | 257/753 |

FOREIGN PATENT DOCUMENTS

KR 2005113936 A * 12/2005

* cited by examiner

*Primary Examiner* — Cheung Lee
(74) *Attorney, Agent, or Firm* — Treyz Law Group; G. Victor Treyz; Jason Tsai

(57) ABSTRACT

A wafer of integrated circuits may be bonded to a carrier wafer using a layer of bonding material. The thickness of the wafer of integrated circuits may then be reduced using a series of grinding operations. After grinding, backside processing operations may be performed to form scribe channels that separate the die from each other and to form through-wafer vias. The scribe channels may be formed by dry etching and may have rectangular shapes, circular shapes, or other shapes. A pick and place tool may have a heated head. The bonding layer material may be based on a thermoplastic or other material that can be released by application of heat by the heated head of the pick and place tool. The pick and place tool may individually debond each of the integrated circuits from the carrier wafer and may mount the debonded circuits in packages.

16 Claims, 7 Drawing Sheets

METHODS FOR SEPARATING INDIVIDUAL SEMICONDUCTOR DEVICES FROM A CARRIER

BACKGROUND

The present invention relates to integrated circuits, and more particularly, to debonding integrated circuits.

Integrated circuits are formed from semiconductor wafers. In a typical semiconductor fabrication process, numerous integrated circuits are formed on a silicon wafer. To facilitate operations such as via formation for backside ball grid arrays, it is often desirable to thin a silicon wafer. Because silicon wafers can become fragile when thinned, wafers are bonded to a carrier before thinning. The carrier helps to stabilize the silicon wafer and prevents the wafer from cracking during thinning and handling during subsequent processes.

During wafer thinning, the backside of the silicon wafer is ground down using a series of grinding and polishing steps. The final silicon wafer thickness may be on the order of 5 to 100 µm. Following wafer thinning, backside processing operations may be performed such as via formation, solder bump formation, and laser annealing.

Once backside processing is complete, a wafer debonding tool is used to separate the thinned silicon wafer from the carrier. The wafer debonding tool contains two heated vacuum chucks. An upper vacuum chuck holds the backside of the silicon wafer while a lower vacuum chuck holds the carrier. A shearing motion is used to pull the silicon wafer from the carrier. Other types of wafer debonding scheme are also sometimes used. These wafer debonding schemes may be based on perforated carrier arrangements, laser debonding configurations, thermal release debonding schemes (e.g., using an oven or hotplate), etc.

Once debonded from the carrier, the thinned wafer may be cleaned and mounted on a film frame wafer carrier. A film frame wafer carrier has a ring of metal that holds an adhesive membrane. The cleaned wafer may be placed face up in the center of the membrane for transport. Once at its intended destination, an ultraviolet light source may be used to degrade the adhesive qualities of the membrane, thereby allowing the silicon wafer to be removed. The silicon wafer can then be diced into individual die and each die may be mounted in a respective package. Dicing operations may also be performed before transport of the wafer.

These schemes pose challenges. For example, a wafer debonding tool may damage a silicon wafer. This is because any chips that form on the edge of the wafer during shear debonding have the potential to scrape across the entire wafer surface. Additionally, handling an unsupported thin wafer though the process of cleaning and film frame mounting after debond operations risks breaking the wafer.

Wafers are typically mounted face up on film frames to reduce the risk of damage from chipping caused by blade vibration during dicing operations. However, wafers that are mounted face up may become contaminated by particles. Although the impact of contamination can be mitigated somewhat by covering the wafer with a permanent glass cover that facilitates cleaning to remove contaminants, glass covers can adversely affect device performance. For example, in integrated circuit image sensors, the presence of the cover glass absorbs and reflects light. The cover glass also may distort incoming light. These optical effects tend to degrade image quality. Wafers can be mounted face down on film frames, but this poses a risk of contamination from the adhesive of the film.

DETAILED DESCRIPTION

Integrated circuits may be formed from semiconductor wafers of any suitable type (e.g., silicon, silicon-on-oxide, gallium arsenide, indium phosphide, germanium, etc.). For clarity, embodiments of the present invention are sometimes described herein in the context of silicon wafers. This is, however, merely illustrative. Circuitry can be formed on other types of semiconductor substrates if desired.

Figure 1:
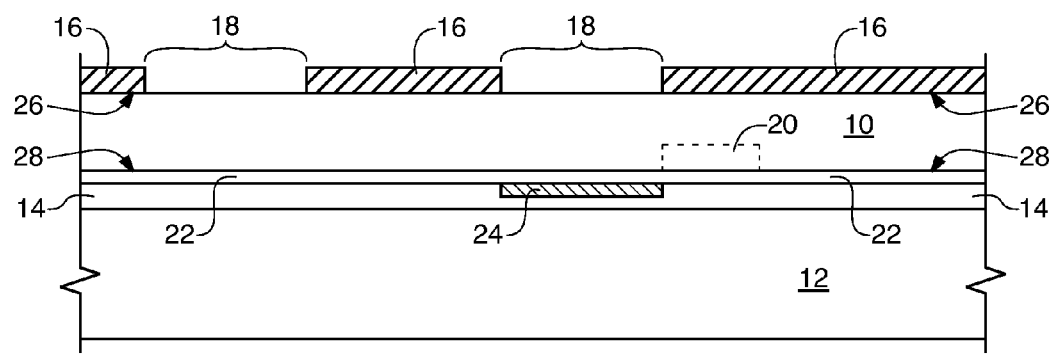
FIG. 1 is a cross-sectional side view of an illustrative wafer that has been bonded to a carrier wafer and thinned in accordance with an embodiment of the present invention.

An illustrative wafer 10 is shown in FIG. 1. As shown in FIG. 1, wafer 10 may be bonded to carrier 12 using bonding layer 14. Carrier 12 may be formed from a silicon wafer or other carrier material. Silicon wafer carriers have the same thermal expansion coefficient as silicon wafer 10, which may help to avoid damage due to mismatched expansion characteristics when wafer 10 and carrier 12 are exposed to temperature fluctuations. Other carriers that may be used include glass wafer carriers, ceramic wafer carriers, carriers formed from other semiconductors, etc. Bonding layer 14 may be formed from a thermoplastic that weakens upon heating or other removable bonding layer material.

During initial semiconductor fabrication operations, integrated circuits are formed on the front face of wafer 10. Circuitry on the front face of wafer 10 is illustrated by circuitry 20 in FIG. 1. In the cross-sectional diagram of FIG. 1, wafer 10 has been mounted face down, so circuitry 20 is formed on the lower surface of wafer 10. The exposed upper surface 26 of wafer 10 represents the backside of wafer 10.

Compatibility with standard semiconductor fabrication processes generally requires that silicon wafers not be too thin. If a thin integrated circuit is desired, wafer thinning operations may be performed after the initial set of integrated circuit manufacturing operations are complete. To facilitate wafer handling following wafer thinning operations, wafer 10 is mounted to carrier 12 as shown in FIG. 1. Backside grinding operations may then be performed to thin wafer 10. In a typical grinding operation, successively finer grades of grit are used to grind down the thickness of silicon wafer 10. Once a desired thickness has been achieved, a dry etch polish or chemical mechanical polish (CMP) operation may be performed to polish the backside of the wafer. During these grinding and polishing operations, carrier 12 may provide structural support Once wafer 10 has been thinned, patterned passivation layer 16 may be formed on backside surface 26. Backside passivation layer 16 may be formed from any suitable etch mask material such as polymer dielectrics (e.g., photoresist such as polyimide, etc.). Openings 18 may be configured to form vias and scribe channels. Vias may be used to form conductive channels between the front and rear surfaces of wafer 10. Through-wafer vias of this type may be used to allow backside interconnects to be formed that connect to frontside circuitry 20. The backside interconnects may, for example, be connected to an array of solder bumps (sometimes referred to as a ball grid array). Scribe channels (which are sometimes referred to as scribe lines, streets, or die separation channels) may be used to divide (dice) wafer 10 into individual die. In the FIG. 1 example, the right-hand opening 18 is associated with formation of a via (i.e., the right-hand opening represents a via-formation opening) and the left-hand opening 18 is associated with formation of a scribe channel (i.e., the left-hand opening represents a scribe channel formation opening). The right-hand opening 18 is laterally aligned with bonding pad 24 (e.g., an aluminum bonding pad or other metal bonding pad structure). The left-hand opening 18 forms an opening in mask layer 16 that surrounds the entire periphery of an integrated circuit on wafer 10. There are typically numerous integrated circuits on wafer 10 and each circuit typically has numerous vias, but a single scribe channel opening and single via opening in passivation layer 16 are shown in FIG. 1 to avoid over-complicating the drawings.

The arrangement of FIG. 1 allows wafer 10 to be divided into individual integrated circuits using dry etching. If desired, other techniques may be used to dice a wafer (e.g., sawing techniques performed while the wafer is still on the carrier, use of a laser to cut up the wafer while the wafer is still on the carrier, etc.). Arrangements in which wafer 10 is divided into die by dry etching scribe channels through the wafer is described herein as an example.

As shown in FIG. 1, an optional thin layer of silicon oxide 22 may be formed in lateral alignment with openings 18 (e.g., as part of the front-side processing operations used to fabricate wafer 10). Layer 22 may serve as an etch stop layer or, in the absence of layer 22, bond pad metal 24 and bond layer material 14 may serve as etch stop. In the via holes, layer 22 may be interposed between bond pad layer 24 and wafer 10. In the scribe channels, layer 22 may be formed on frontside surface 28 of wafer 10.

Figure 2:
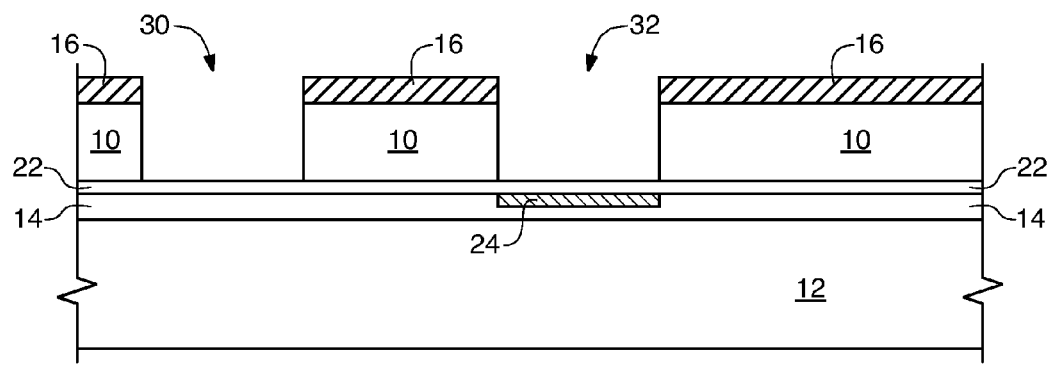
FIG. 2 is a cross-sectional side view of an illustrative wafer and carrier following a backside via and scribe channel etch operation in accordance with an embodiment of the present invention.

After the etch mask pattern of passivation layer 16 has been formed, wafer 10 may be dry etched to form the structure of FIG. 2. Dry etching may be performed using any suitable dry etch tool (e.g., a plasma etch tool, a reactive ion etch tool, etc.). As shown in FIG. 2, the dry etch process forms scribe channel 30 and vias such as via 32.

Figure 3:
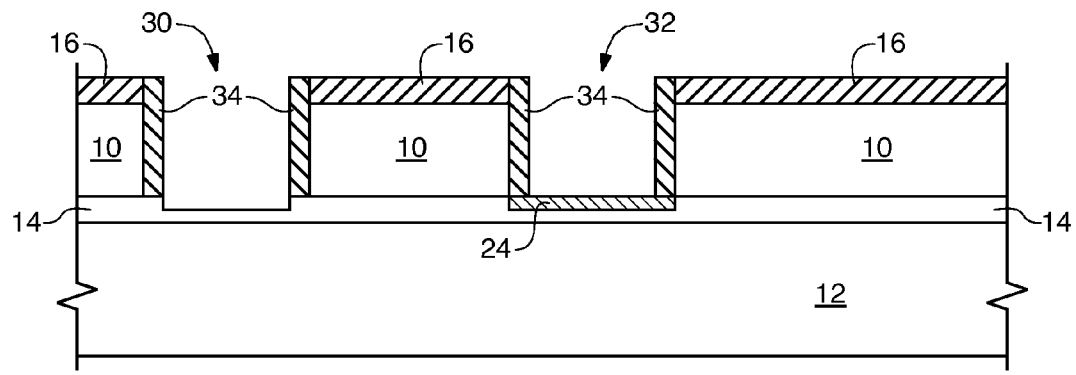
FIG. 3 is a cross-sectional side view of the wafer and carrier of FIG. 2 following sidewall passivation in accordance with an embodiment of the present invention.

After dry etching is complete and all desired scribe channels and vias have been formed, a sidewall passivation layer such as sidewall passivation layer 34 of FIG. 3 may be formed. Sidewall passivation layer 34 may be formed by depositing a layer of photoresist or other passivation material onto the bottoms and sidewalls of channel 30 and via 32 followed by a directional dry etch to remove the bottom passivation layer. Oxide layers 22 of FIG. 2 may then be removed using an oxide etch. At this stage of the process, each integrated circuit on wafer 10 will have been divided into a separate die by its peripheral scribe channel 30, but will still be bonded to carrier 12 by bond layer 14 as shown in FIG. 3.

Figure 4:
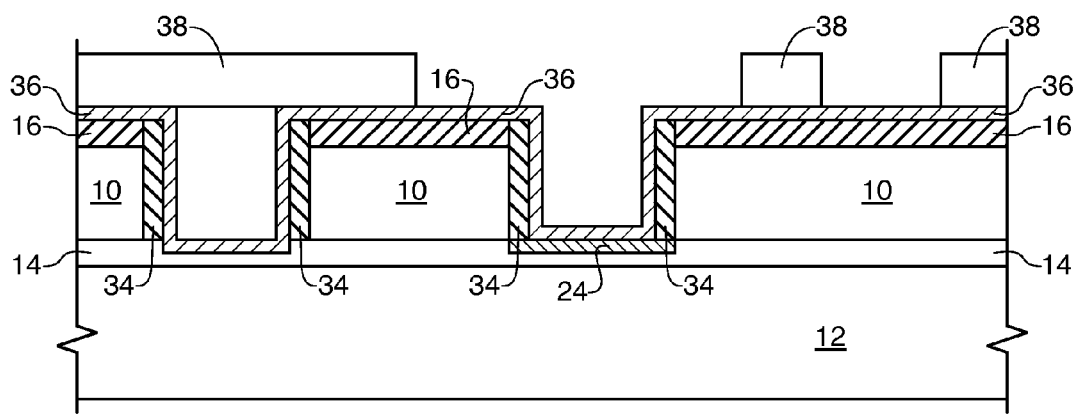
FIG. 4 is a cross-sectional side view of the wafer and carrier of FIG. 3 following addition of an adhesion and diffusion barrier layer and plating mask in accordance with an embodiment of the present invention.

As shown in FIG. 4, after the sidewall mask layer of FIG. 3 has been formed, the backside of wafer 10 may be coated with layer 36. Layer 36 may include an adhesion promotion and diffusion barrier layer that is coated with a plating seed layer such as copper. The adhesion promotion and diffusion barrier properties of layer 36 may be implemented using one or more material layers. As an example, a layer of titanium tungsten may be used to form an adhesion promotion and diffusion barrier layer for layer 36. Other materials that may be used as an adhesion promotion and diffusion barrier layer include tantalum nitride, titanium nitride, and titanium (as example). A layer of copper or other suitable seed material may be formed in layer 36 (e.g., on top of the adhesion promotion and diffusion barrier material). The materials of layer 36 may be deposited using physical vapor deposition (PVD) techniques (e.g., sputtering). Following deposition of layer 36, a patterned mask layer such as layer 38 may be formed. Mask layer 38 may be formed from a laminated or spun-on photoresist. Layer 38 may be lithographically patterned to cover the portions of layer 36 where no further metal growth is desired (i.e., layer 38 may serve as an electroplating mask for subsequent electrochemical deposition operations).

After plating mask 38 has been formed, the thickness of layer 36 in the regions of layer 36 that are not covered with mask 38 may be increased using electrochemical deposition (e.g., electroplating with copper, nickel, palladium, etc.). The photoresist of plating mask 38 may then be stripped and the thin portions of layer 36 that were temporarily covered by the plating mask 38 may be etched away.

Figure 5:
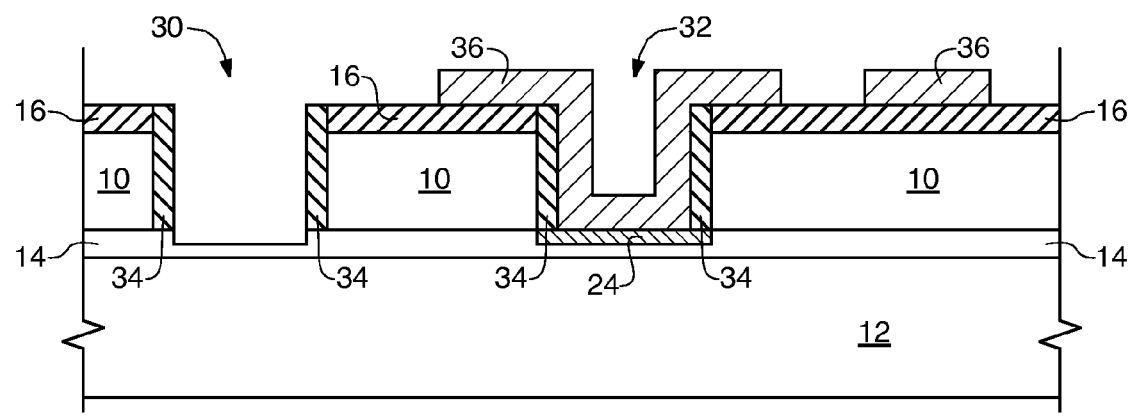
FIG. 5 is a cross-sectional side view of the wafer and carrier of FIG. 4 following plating and metal etching operations in accordance with an embodiment of the present invention.

Following the seed layer etch process, wafer 10 and carrier 12 may appear as shown in FIG. 5. As shown in FIG. 5, the plating operation results in an increase in the thickness of layer 36, so that layer 36 can be used to attach solder bumps or other such contacts to the backside of wafer 10. The seed layer etch process removes residual portions of layer 36.

After thickening layer 36 by electroplating, a final passivation operation may be used to coat the backside of wafer 10 with one or more patterned passivation layers. These layers, which are shown as layer 40 in FIG. 6 and may include an infrared blocking layer, a solder mask layer, a layer that serves both as an infrared blocking layer and a solder mask layer, etc. In integrated circuits for image sensors, layer 40 may include a material that blocks infrared light. In other types of integrated circuits, layer 40 can be formed from materials with different infrared transmission properties. A typical material that may be used for layer 40 is photoresist.

This allows layer 40 to be patterned using optical photolithography. Other types of materials and patterning techniques may be used for forming layer 40 if desired. The pattern of layer 40 that is formed has openings such as opening 42 for forming solder ball connections and an opening 44 that leaves scribe channel 30 unfilled with material. Once patterned passivation layer 40 has been formed, each integrated circuit on wafer 10 is ready to be debonded from carrier 12. At this processing stage, the individual integrated circuits on wafer 10 are sometimes referred to as "die." The type of debonding arrangement that is used to debond the integrated circuit die depends on the type of bonding layer 14 that was used to bond wafer 10 to carrier 12. For example, some bond layer materials may be deactivated using solvent or ultraviolet light exposure. More typically, heat and physical force is used to perform debond operations.

In conventional wafer-level debond arrangements, a wafer is separated from its carrier before the wafer is diced into individual integrated circuit die. This can lead to issues with damage and contamination. To avoid these issues, wafer 10 can be divided into die using the dry etch technique of FIGS. 2-6 or other die separation techniques (e.g., laser cutting, sawing, etc.). Once the die have been separated from each other, a pick and place tool may be used to debond each die from carrier 12 individually.

Figure 7:
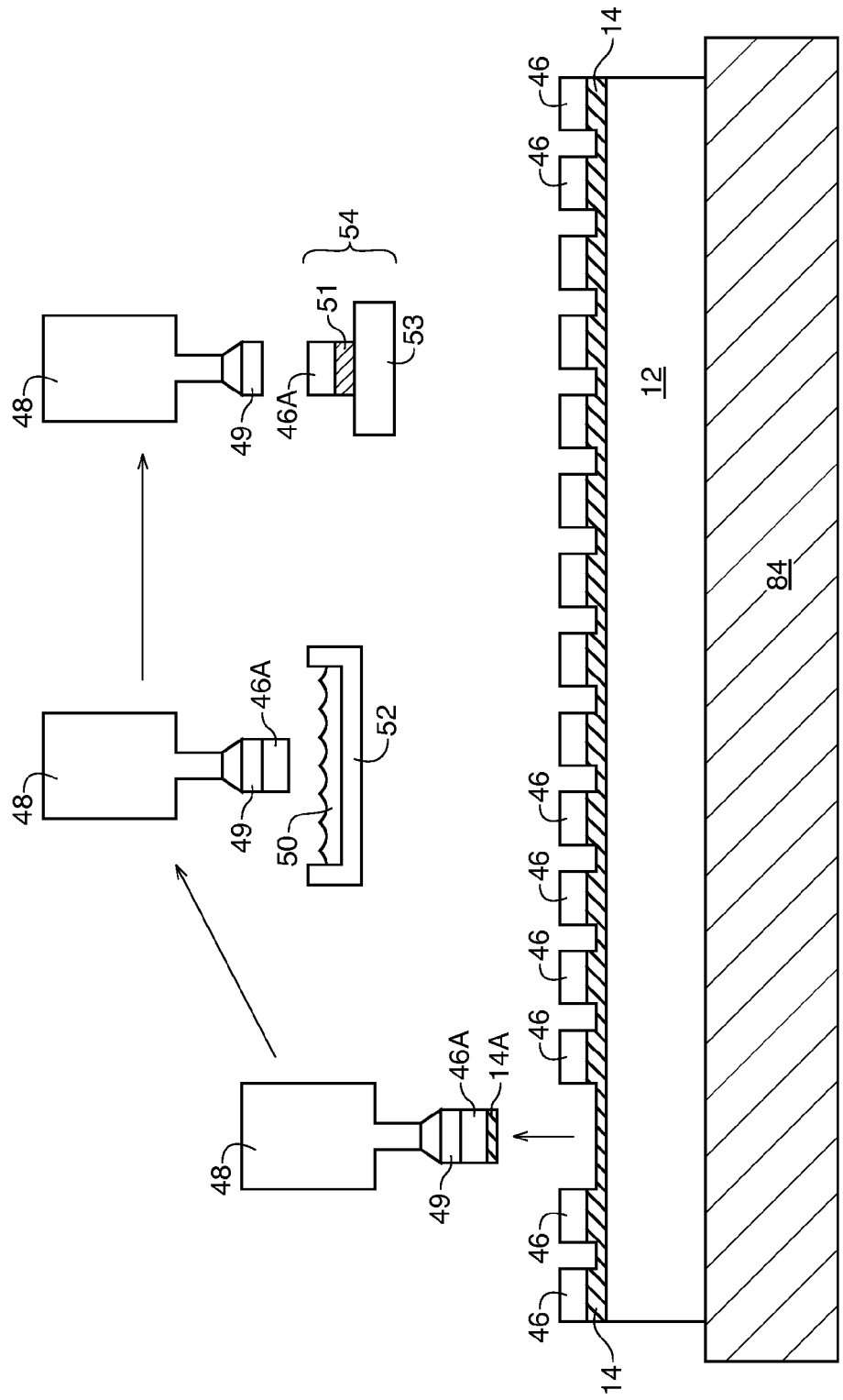
FIG. 7 is a diagram showing how a pick and place system may be used to perform debond and packaging operations in accordance with an embodiment of the present invention.

This type of individual debonding arrangement is shown in FIG. 7. As shown in FIG. 7, following the process of dividing wafer 10 into individual integrated circuits, carrier 12 has a bonding layer 14 that is covered with multiple individual die 46. Debonding and packaging equipment may be used to individually remove each die 46 from carrier 12 and mount that die 46 in a corresponding integrated circuit package. The debonding and packaging equipment may be, for example, a pick and place machine with a heated head (shown as pick and place tool 48 and head 49 in FIG. 7). Pick and place tool 48 may a heated chuck (shown as heated chuck 84 in FIG. 7). Chuck 84 may be used in conjunction with heated head 49 or may be used in place of heated head 49.

Several stages of the die debonding process are shown in FIG. 7.

Initially, pick and place tool 48 positions its head 49 over a desired die 46. The head may then be heated and, when the heat has loosened the attachment of the die to carrier 12 by weakening bonding layer material 14, the pick and place tool 48 may remove the die from the carrier. For example, on the left-hand side of FIG. 7, pick and place tool 48 has debonded die 46A from carrier 12. As shown by bond layer portion 14A, a residual amount of bond layer 14 may remain on the surface of the debonded die.

Following debonding, the debonded die may be cleaned to remove the residual bond layer material. This process is illustrated in the center of FIG. 7. As shown in the center of FIG. 7, die 46A has been cleaned of residual material (i.e., no bond layer material 14A remains on the surface of die 46A) by exposing die 46A to cleaning solution 50 in reservoir 52. Cleaning solution 50 may include acetone, isopropyl alcohol, solutions of acetone and isopropyl alcohol, or other solvents that dissolve and remove bond layer material 14. Pick and place tool 48 may have an ultrasonic transducer in head 49 that may facilitate removal of die 46A from bond layer 14 and that may be used to help remove residual bond layer material 14A from die 46A during cleaning.

After cleaning, the cleaned and debonded die may be mounted ("placed") on a mounting structure. In the example of FIG. 7, package 53 has an optical structure such as lens 51 (e.g., an optical lens system having one or more lens elements) for forming a camera module. As illustrated on the right-hand side of FIG. 7, pick and place tool 48 may mount die 46A to package 53 by placing die 46A on structure 51, thereby forming packaged integrated circuit 54. Additional process steps may be used to form solder balls, etc. In general, die 46A may be mounted to an integrated circuit package or other structure using adhesive, wire bonding, solder ball mounting, and other packaging arrangements. For example, a debonded die may be placed in a stack (e.g., when the die is an integrated circuit such as a dynamic random-access memory circuit or logic chip). The arrangement of FIG. 7 in which die 46A is packaged as part of a camera module with a lens is merely illustrative.

Figure 8:
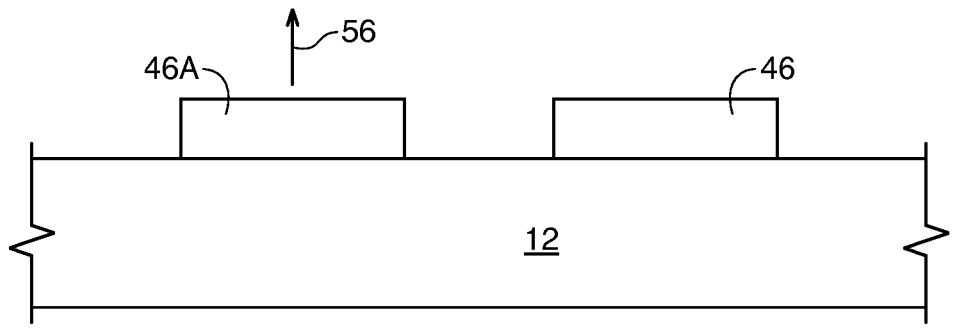
FIG. 8 is a cross-sectional side view of die on a carrier showing how die may be debonded using a vertical removal technique in accordance with an embodiment of the present invention.
Figure 9:
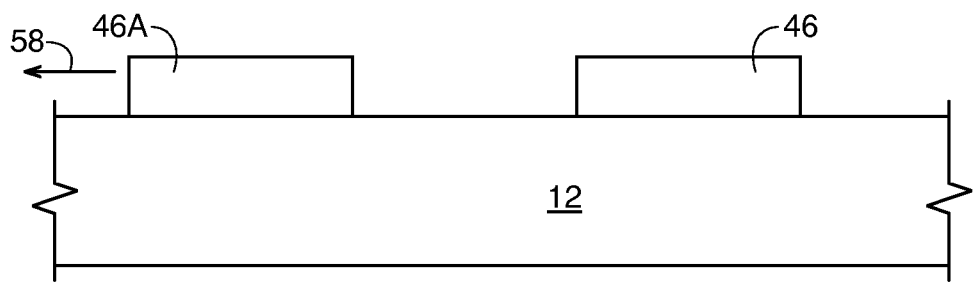
FIG. 9 is a cross-sectional side view of die on a carrier showing how die may be debonded using a shearing removal technique in accordance with an embodiment of the present invention.
Figure 10:
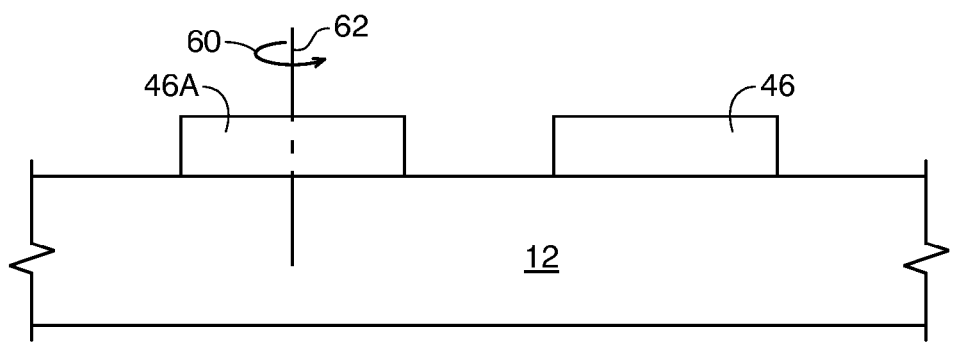
FIG. 10 is a cross-sectional side view of die on a carrier showing how die may be debonded using twisting motions in accordance with an embodiment of the present invention.

Pick and place tool 48 may remove die from wafer 10 using removal techniques such as a vertical removal technique, a shearing removal technique, and a twisting removal technique. With a vertical removal technique, die 46A may be pulled away from carrier 12 in vertical direction 56, as shown in FIG. 8. With a shearing operation, die 46A may be removed sideways in lateral direction 58, as shown in FIG. 9. To avoid damaging die 46A during a shearing removal operation of the type illustrated in FIG. 9, pick and place tool 48 may remove die located at the periphery of wafer 10 and carrier 12 before moving inward to remove more centrally located die. As shown in FIG. 10, a twisting motion may be used by pick and place tool 48 when removing die from carrier 12. The twisting motion may involve rotation of die 46A completely about rotational axis 62 (i.e., 360° or more) or may involve a back-and-forth twisting motion involving smaller rotational motions. Combinations of the motions of FIGS. 8, 9, and 10 may also be used.

Figure 11:
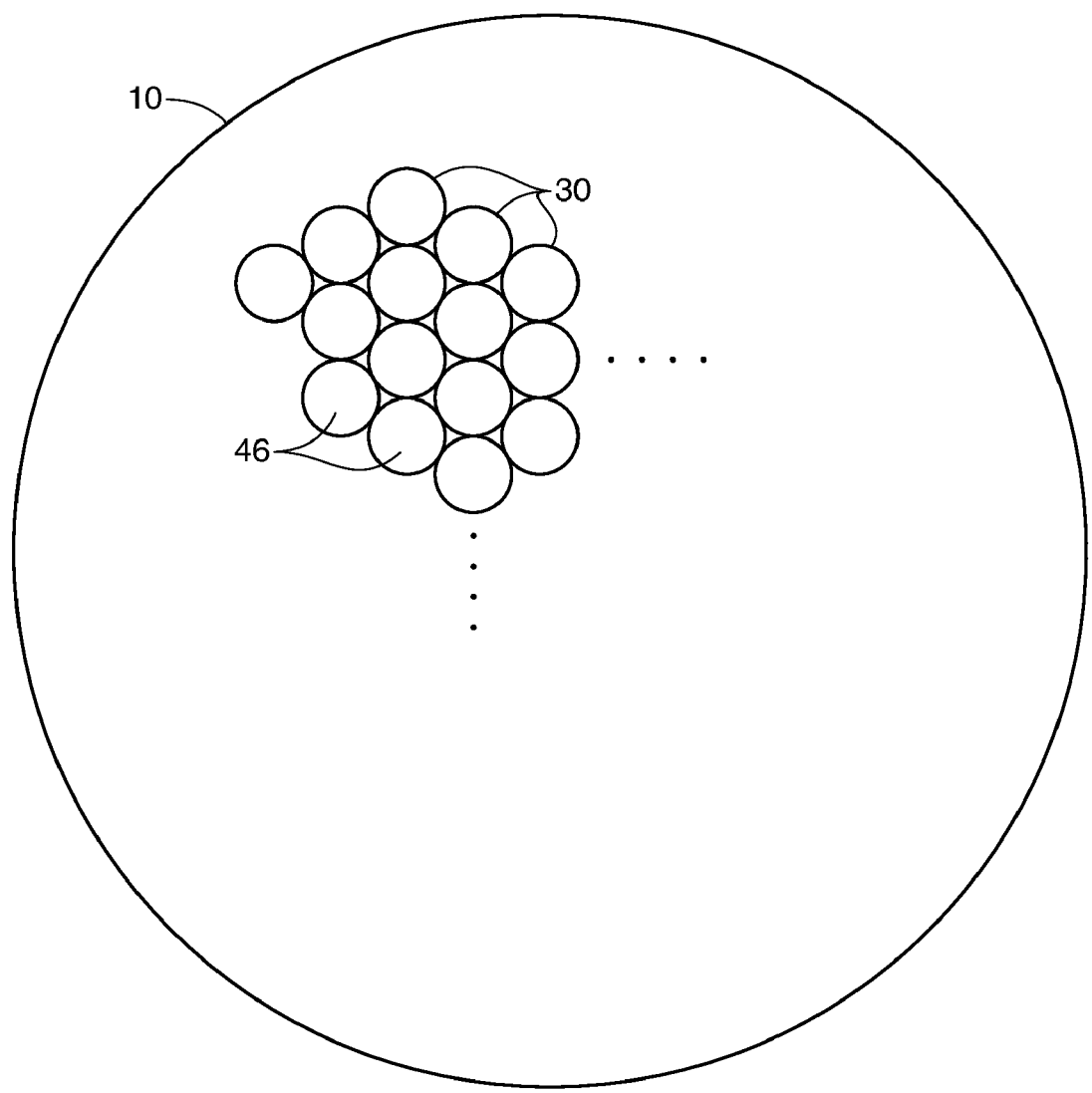
FIG. 11 is a top view showing how scribe channels on a wafer may be etched in a circular pattern to facilitate twisting debond operations in accordance with an embodiment of the present invention.

If desired, scribe channels such as scribe channel 30 may be formed with circular outlines, as shown in the top view of wafer 10 in FIG. 11. When die 46 are divided using circular scribe channel shapes of the type shown in FIG. 11, pick and place tool 48 may rotate each die 46 without risk of striking adjacent die. Other scribe channel shapes may also be used (e.g., squares and other rectangles, polygons with three, four, five, six, or more than six sides), channel shapes with curved and straight segments, etc. A mixture of scribe channel shapes of different types may also be used. For example, a wafer may have some circular die and some square die (as an example). An advantage of forming die 46 with round shapes is that this type of die shape matches well with round camera lenses (i.e., round camera lenses may be mounted directly to a circular die). This may help to reduce the size of a packaged circuit module (e.g., a small wafer level camera). There may be some loss of wafer area when circular die are used, but at small circular die sizes (e.g., 1 mm to 2 mm in diameter), the amount of unutilized wafer area in a circular die arrangement can be offset by a comparable amount of wafer area savings achieved by avoiding the use of a rectangular grid of conventional 100 μm scribe channels through use of narrow dry etched channels.

Figure 12:
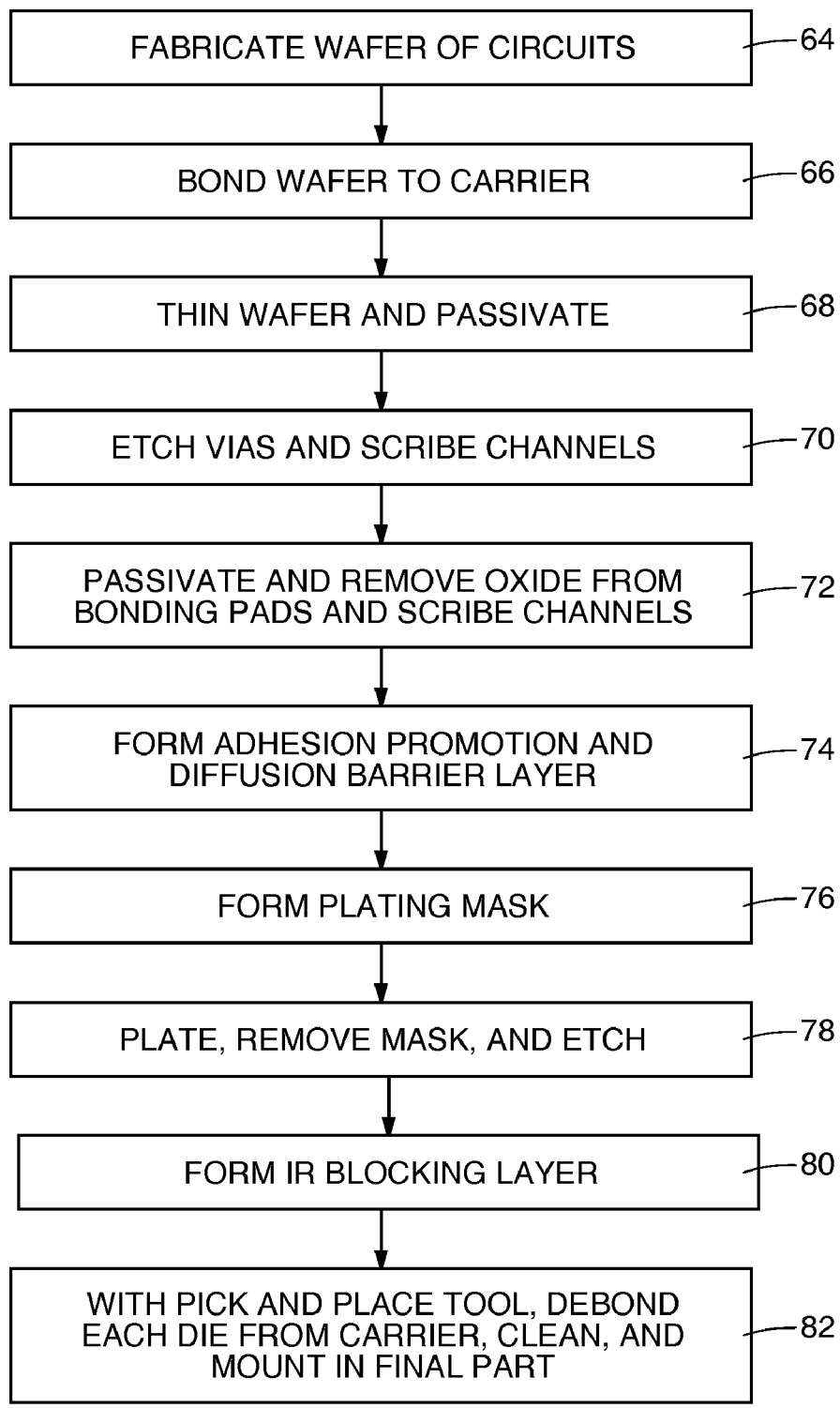
FIG. 12 is a flow chart of illustrative steps involved in performing pick and place debond operations in accordance with an embodiment of the present invention.

Illustrative steps involved in performing integrated circuit processing operations such as individual die pick and place debond operations are shown in FIG. 12.

At step 64, wafer 10 may be processed in a semiconductor processing facility to produce circuitry (e.g., to produce a number of integrated circuits on its frontside surface).

At step 66, wafer 10 may be bonded to carrier 12 (e.g., using a thermoplastic or other bond layer material 14).

At step 68, wafer 10 may be thinned using grinding and polishing equipment. Wafer 10 may, for example, be thinned from an initial thickness of 730 microns or more to a thickness of less than 250 microns, less than 150 microns, less than 100 microns, or less than 50 microns.

At step 70, scribe channels such as scribe channel 30 of FIG. 3 and vias such as via 32 of FIG. 3 may be formed through wafer 10. If desired, scribe channels (die separation channels) may be formed using laser cutting, sawing, or other die separation techniques. The use of dry etching to form scribe channels 30 is merely illustrative.

At step 72, passivation layers may be formed over the sidewalls of the vias and scribe channels and oxide etch stops at the bottom of the vias and scribe channels may be removed, as described in connection with FIG. 3.

At step 74, adhesion promotion and diffusion barrier layer 36 of FIG. 4 may be formed. Layer 36 may include a seed layer of copper or other suitable seed metal for initiating subsequent electroplating deposition.

At step 76, plating mask 38 of FIG. 4 may be patterned on the backside surface of wafer 10.

At step 78, wafer 10 may be plated to increase the thickness of layer 36 where not covered by mask 38 (see, e.g., FIG. 5).

Figure 6:
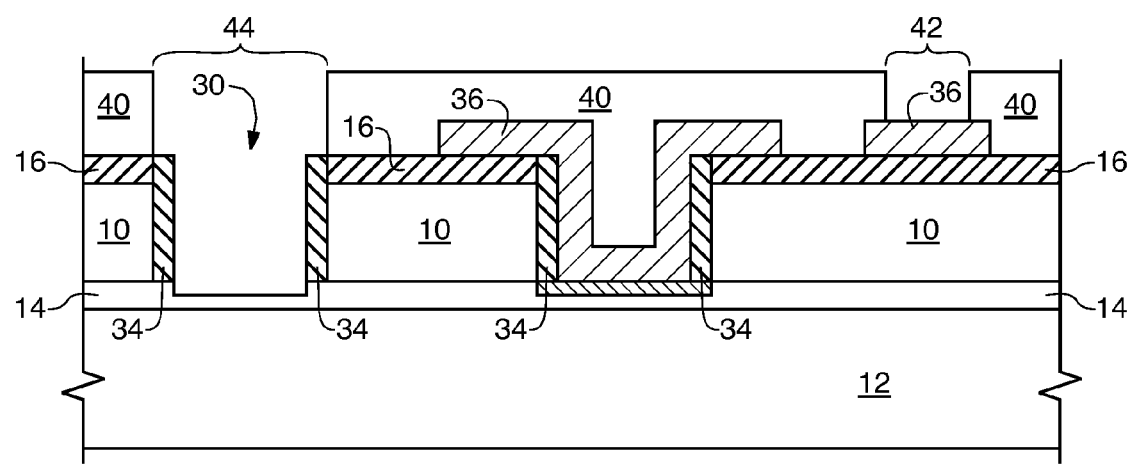
FIG. 6 is a cross-sectional side view of the wafer and carrier of FIG. 5 following addition of an infrared blocking layer and a solder mask layer in accordance with an embodiment of the present invention.

At step 80, a patterned backside passivation layer such as layer 40 of FIG. 6 may be formed on the backside of wafer 10. Layer 40 may include one or more layers of material (e.g., an infrared blocking layer, a solder mask layer, a layer that performs both infrared blocking and solder mask functions, etc.).

At step 82, individual debonding operations may be performed. As described in connection with FIG. 7, pick and place tool 48 may remove individual die 46 from carrier 12 while the remaining die on carrier 12 remain in place. Cleaning and mounting operations may then be performed using the same pick and place tool. There is no risk of contamination of the die during shipping, because the debonding operation may take place at the same location and facility as the final placement operation where die 46 is mounted in a package (e.g., to form packaged integrated circuit 54 of FIG. 7).

Various embodiments have been described illustrating how a pick and place tool may be used to debond individual die from a carrier. A wafer may be processed using semiconductor fabrication techniques to form an array of integrated circuits on its frontside surface. The wafer may then be bonded to a carrier so that the backside of the wafer is exposed. Following grinding operations to thin the wafer, dry etching or other techniques may be used to divide the wafer into individual die, each of which contains a respective one of the integrated circuits. The die initially remain face down on the carrier. Using a pick and place tool, the die may be individually debonded from the carrier. A vertical debond process, a shearing debond process, or a twisting debond process may be used during debonding. Each debonded die may be cleaned in a solvent and placed on a respective integrated circuit package for use in a system.

The foregoing is merely illustrative of the principles of this invention which can be practiced in other embodiments.

What is claimed is:

1. A method, comprising:
fabricating a wafer of integrated circuits;
bonding the wafer of integrated circuits to a carrier with a layer of bonding material; and
with a pick and place tool, debonding a given integrated circuit by removing the given integrated circuit from the carrier while other integrated circuits from the wafer remain bonded to the carrier, wherein the carrier has a planar surface and wherein debonding the given integrated circuit from the carrier comprises heating the given integrated circuit using a heated head in the pick and place tool to weaken the layer of bonding material and moving the given integrated circuit laterally with respect to the planar surface to remove the given integrated circuit from the layer of bonding material in a shearing motion.

2. The method defined in claim 1 further comprising:
after bonding the wafer of integrated circuits to the carrier, thinning the wafer.

3. The method defined in claim 2 wherein thinning the wafer comprises grinding the wafer.

4. The method defined in claim 1 wherein bonding the wafer comprises attaching the wafer to a silicon wafer carrier.

5. The method defined in claim 1 wherein removing the given integrated circuit from the carrier with the pick and place tool further comprises heating the given integrated circuit with a heated chuck in the pick and place tool.

6. The method defined in claim 1 wherein debonding the given integrated circuit further comprises:
with the pick and place tool, vertically lifting the given integrated circuit from the carrier after moving the given integrated circuit laterally with respect to the planar surface of the carrier.

7. The method defined in claim 1 further comprising forming a scribe channel about each of the integrated circuits after the wafer of integrated circuits has been fabricated and before the given integrated circuit is debonded.

8. The method defined in claim 1 further comprising forming a plurality of circular scribe channels through the wafer, each of which surrounds a respective one of the integrated circuits.

9. The method defined in claim 1 further comprising:
etching a separate channel around each of the integrated circuits before debonding any of the integrated circuits from the carrier.

10. The method defined in claim 9 further comprising:
with the pick and place tool, mounting the given integrated circuit in a package.

11. The method defined in claim 1 further comprising:
with the pick and place tool, mounting the given integrated circuit in a package.

12. The method defined in claim 11 further comprising:
after removing the given integrated circuit from the carrier and before mounting the given integrated circuit in the package, removing the layer of bonding material from the given integrated circuit by exposing the given integrated circuit to a solvent using the pick and place tool.

13. A method, comprising:
fabricating a wafer of integrated circuits;
bonding the wafer of integrated circuits to a carrier with a layer of bonding material;
with a pick and place tool, debonding a given integrated circuit by removing the given integrated circuit from the carrier while other integrated circuits from the wafer remain bonded to the carrier, wherein the carrier has a planar surface and wherein debonding the given integrated circuit from the carrier comprises moving the given integrated circuit laterally with respect to the planar surface to remove the given integrated circuit from the layer of bonding material in a shearing motion;
with the pick and place tool, mounting the given integrated circuit in a package; and
after removing the given integrated circuit from the carrier and before mounting the given integrated circuit in the package, removing the layer of bonding material from the given integrated circuit by exposing the given integrated circuit to a solvent using the pick and place tool.

14. The method defined in claim 13 further comprising:

after bonding the wafer of integrated circuits to the carrier, thinning the wafer.

15. The method defined in claim 13 wherein bonding the wafer comprises attaching the wafer to a silicon wafer carrier.

16. The method defined in claim 13 further comprising:

etching a separate channel around each of the integrated circuits before debonding any of the integrated circuits from the carrier.

* * * * *